United States Patent [19]

Hsu et al.

[11] Patent Number: 5,241,203
[45] Date of Patent: Aug. 31, 1993

[54] INVERSE T-GATE FET TRANSISTOR WITH LIGHTLY DOPED SOURCE AND DRAIN REGION

[75] Inventors: Louis L. Hsu, Fishkill; Seiki Ogura; Joseph F. Shepard, both of Hopewell Junction; Paul J. Tsang, Poughkeepsie, all of N.Y.

[73] Assignee: International Business Machines Corporation, Armonk, N.Y.

[21] Appl. No.: 824,228

[22] Filed: Jan. 22, 1992

Related U.S. Application Data

[62] Division of Ser. No. 727,992, Jul. 10, 1991, Pat. No. 5,120,668.

[51] Int. Cl.$^5$ .................. H01L 29/76; H01L 29/94; H01L 31/062; H01L 23/48
[52] U.S. Cl. .................. 257/344; 257/382; 257/408; 257/412; 257/754
[58] Field of Search .................. 357/23.1, 23.3, 23.4; 437/41; 257/344, 382, 408, 412, 754, 763

[56] References Cited

U.S. PATENT DOCUMENTS

| | | | |
|---|---|---|---|
| 3,438,121 | 4/1969 | Wanlass et al. | 437/44 |
| 4,728,617 | 3/1988 | Woo et al. | 437/30 |
| 4,728,620 | 3/1988 | Jeuch | 437/41 |
| 4,818,715 | 4/1989 | Chao | 357/23.3 |
| 4,889,827 | 12/1989 | Willer | 437/41 |
| 4,906,589 | 3/1990 | Chao | 437/44 |
| 4,907,048 | 3/1990 | Huang et al. | 357/23.3 |
| 4,927,782 | 5/1990 | Davey et al. | 437/184 |
| 4,929,567 | 5/1990 | Park et al. | 437/41 |
| 4,939,154 | 7/1990 | Shimbo | 437/41 |
| 4,963,504 | 10/1990 | Huang | 437/44 |
| 5,015,599 | 5/1991 | Verhaar | 357/23.3 |
| 5,053,849 | 10/1991 | Izawa et al. | 437/41 |
| 5,061,647 | 10/1991 | Roth et al. | 437/41 |
| 5,097,301 | 3/1992 | Sanchez | 357/23.3 |
| 5,120,668 | 6/1992 | Hsu et al. | 437/41 |

FOREIGN PATENT DOCUMENTS

| | | | |
|---|---|---|---|
| 61-36975 | 2/1986 | Japan | 357/23.3 |
| 61-94371 | 5/1986 | Japan | 357/23.3 |
| 1-89461 | 4/1989 | Japan | 357/23.3 |
| 1-179363 | 7/1989 | Japan | 357/23.3 |
| 1-206667 | 8/1989 | Japan | 257/408 |
| 1-278074 | 11/1989 | Japan | 357/23.3 |
| 1-286363 | 11/1989 | Japan | 357/23.3 |

*Primary Examiner*—Rolf Hille
*Assistant Examiner*—Steven Loke
*Attorney, Agent, or Firm*—Whitham & Marhoefer

[57] ABSTRACT

A lightly doped drain, field effect transistor with an inverted "T"-gate structure has a gate electrode disposed on a polysilicon pad in a stack opening. The inner edge of a lightly-doped source and drain region is aligned with the gate electrode and its outer edge is aligned with an edge of the polysilicon pad. The inner edge of a heavily-doped source and drain region is aligned with the edge of the edge of the polysilicon pad and its outer edge is aligned with the wall surface that forms the opening. The inner edge of a source and drain contact region is aligned with the wall and extends under the stack.

2 Claims, 3 Drawing Sheets

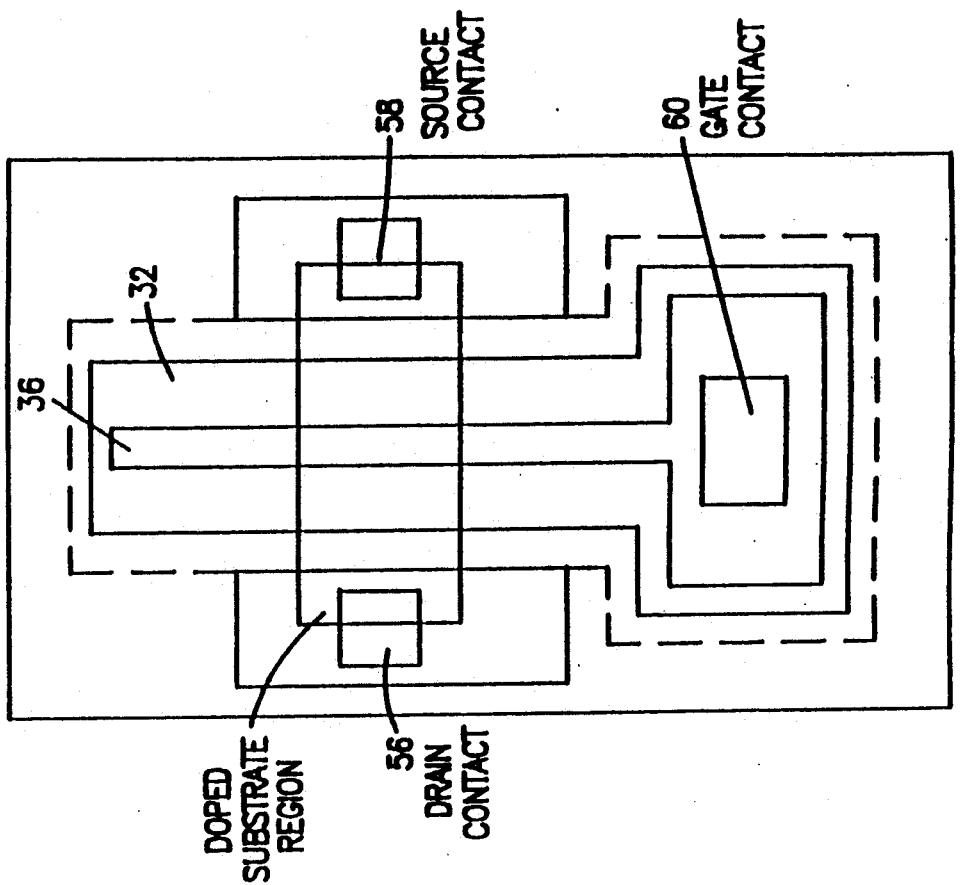
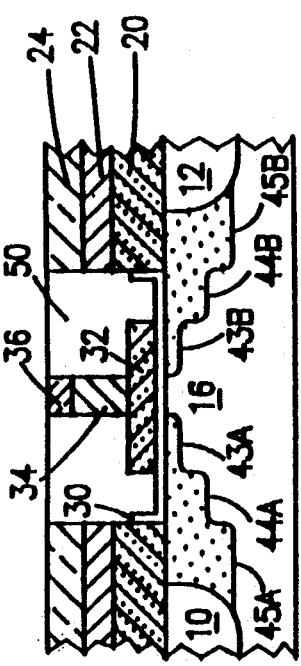
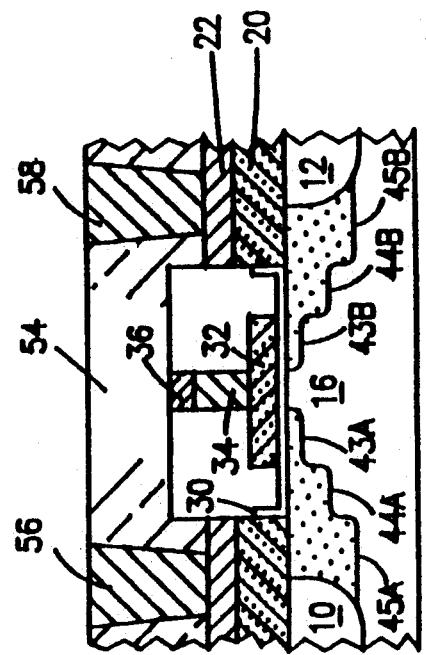

INVERSE T-GATE FET TRANSISTOR WITH LIGHTLY DOPED SOURCE AND DRAIN REGION

This application is a divisional of co-pending application Ser. No 07/727,992, filed on Jul. 10, 1991, now U.S. Pat. No. 5,120,668.

BACKGROUND OF THE INVENTION

1. Field of the Invention

The present invention generally relates to a method of manufacturing a self-aligned, lightly-doped drain (LDD) field effect transistor, and more particularly to a method for producing inverse T-gate LDD structures with sub-micron channel lengths and fully self-aligned features, including source and drain contacts.

2. Description of the Prior Art

The advantages of LDD inverse T-gate field effect transistor structures are well known in the art and there have been a number of proposals in the prior art relating to such devices and their fabrication.

Japanese patent number 1-206667 dated 89.08.18 discloses a transistor gate electrode equipped with a two-layer structure, wherein a lower gate electrode has a higher etching selectivity in a reactive ion etching process than an upper gate electrode, and the lower gate electrode is equipped with a film 500 angstroms or less in thickness allowing ion implantation therethrough. As compared with the upper gate electrode, the lower gate electrode is designed to expand in the MOS transistor channel direction, and to be shaped as inverted T.

U.S. Pat. No. 4,963,504 to Huang, entitled "Method for Fabricating Double Implanted LDD Transistor Self-Aligned With Gate", discloses a double implanted and aligned LDD transistor comprising a gate having a central alignment member and a pair of outboard alignment members having portions contiguous with the gate oxide layer. A lightly-doped junction is aligned with the central alignment member and a heavily doped junction is aligned with the outboard alignment members.

U.S. Pat. No. 4,939,154 to Shimbo, entitled "Method of Fabricating An Insulated Gate Semiconductor Device Having a Self-Aligned Gate", discloses a fabrication method for miniature insulated gate semiconductor devices, such as MOS and CMOS devices, in which their gates are formed by self-alignment with a lightly-doped drain (LDD) structure.

The following patents also disclose various LLD structures and fabrication methods.

U.S. Pat. No. 4,818,715 to Chao, entitled "Method of Fabricating a LDDFET With Self-Aligned Silicide".

U.S. Pat. No. 4,728,617 to Woo et al., entitled "Method of Fabricating a MOSFET With Graded Source and Drain Regions".

U.S. Pat. No. 4,889,827 to Willer, entitled "Method For The Manufacture of a MOSFET Comprising Self-Aligned Gate".

U.S. Pat. No. 3,438,121 to Wanlass et al., entitled "Method of Making a Phosphorous-Protected Semiconductor Device".

U.S. Pat. No. 4,929,567 to Park et al., entitled "Method of Manufacturing a Self-Aligned GaAs MOSFET with T Type Tungsten Gate".

U.S. Pat. No. 4,927,782 to Davey et al., entitled "Method of Making Self-Aligned GaAs/AlGaAs FETs".

U.S. Pat. No. 4,906,589 to Chao, entitled "Inverse-T LDDFET With Self-Aligned Silicide".

SUMMARY OF THE INVENTION

One object of this invention is the provision of a process that uses relatively low resolution lithographic tools and process yet yields an LDD FET inverted "T"-gate feature resolution comparable to that achievable in the prior art with only sophisticated lithographic tools and processes.

Another object of the invention is the provision of a process for forming an FET that forms a completely self-aligned "T" gate.

Briefly, this invention contemplates the provision of a method of forming a self-aligned LDD field effect transistor with an inverted "T"-gate structure in which consecutive, conformal layers of polysilicon, metal and nitride or oxide are deposited to fill a recess in a composite interconnect layer on top of a trench-isolated region of a semiconductor substrate. These conformal layers are selectively etched in two steps to form a self-aligned inverted T structure. A first reactive ion etch (RIE) step preferentially etches the exposed outer polysilicon to a certain depth. During a second RIE step the polysilicon layer is completely etched down to a gate oxide surface and the metal layer is preferentially etched so that it subtends only the remaining nitride or oxide cap. The first step etch rate ratio of polysilicon to metal is about 10:1 and to nitride or oxide about 20 to 1. The second step etch rate ratio of metal to polysilicon is about 2 to 1 and to nitride or oxide about 4 to 1.

BRIEF DESCRIPTION OF THE DRAWINGS

The foregoing and other objects, aspects and advantages will be better understood from the following detailed description of a preferred embodiment of the invention with reference to the drawings, in which FIGS. 1 through 10 are sectional views illustrating the process steps in accordance with the teachings of this invention.

FIG. 11 is a plan view of one embodiment of a completed device in accordance with the teachings of this invention.

DETAILED DESCRIPTION OF THE INVENTION

Figure 1:
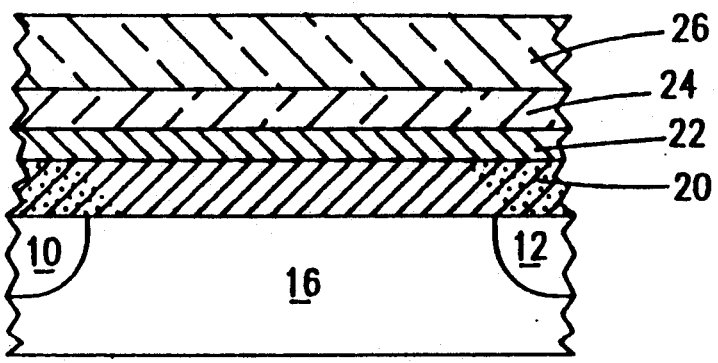

Referring now to FIGS. 1 through 10, shallow dielectric filled trenches 10 and 12 are formed in the surface of a semiconductor substrate 14 to isolate an active region 16 using suitable prior art process steps. The active region 16 is ion implanted to obtain a desired threshold conductivity level (N or P), again using a suitable prior art process. The surface is cleaned and the following layers are deposited in situ; a chemical vapor deposited (CVD) doped polysilicon layer 20 (approximately 1800A), a CVD tungsten layer 22 (approximately 1200A), a nitride (or oxide) layer 24 (approximately 1500A), and a TEOS layer 26 (approximately 4000A). CVD tungsten is deposited in a conventional hot wall reactor using reduction of WF6 by Si and H2, as described in K. Y. Tsao, et al., J. Electrochem, Soc., 131 (11), pp. 2702, 1984. The product at the completion of these process steps is shown in FIG. 1.

Figure 2:
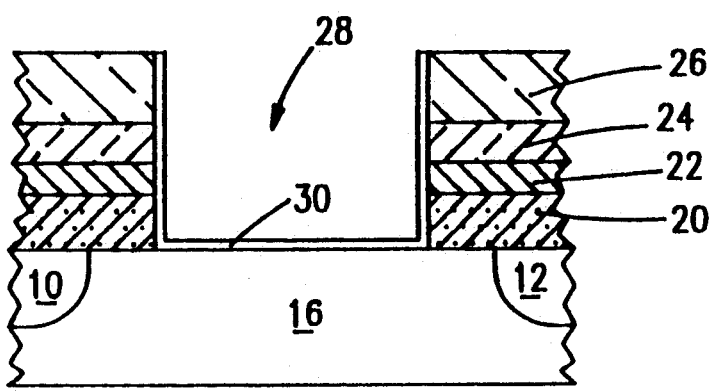

Next the upper surface of the TEOS layer 26 is coated with a resist and patterned with a conventional lithograph stepper providing feature sizes on the order of 0.8 μm. An opening 28 is formed with an anisotropic side wall profile by reactive ion etch of the TEOS layer 26 and the nitride layer 24 in a $CF_4/O_2$ plasma and the CVD tungsten and polysilicon layers in a $SF_6/Cl_2/O_2$ plasma. Any RIE damage is removed, for example using a wet etch or sacrificial oxide, and a gate oxide layer 30 (about 120Å) is grown in the bottom of the opening 28 covering a portion of the upper surface of the active region 16. The formation of volatile oxides of tungsten during a conventional oxidation process may degrade device characteristics. To overcome this problem a wet hydrogen oxidation is used, the process is described in N. Kobayashi, et al., "Highly Reliable Tungsten Gate Technology", Proc. of 1987 Material Research Society Symposium p. 159–167. FIG. 2 shows the process to this step.

Figure 3:
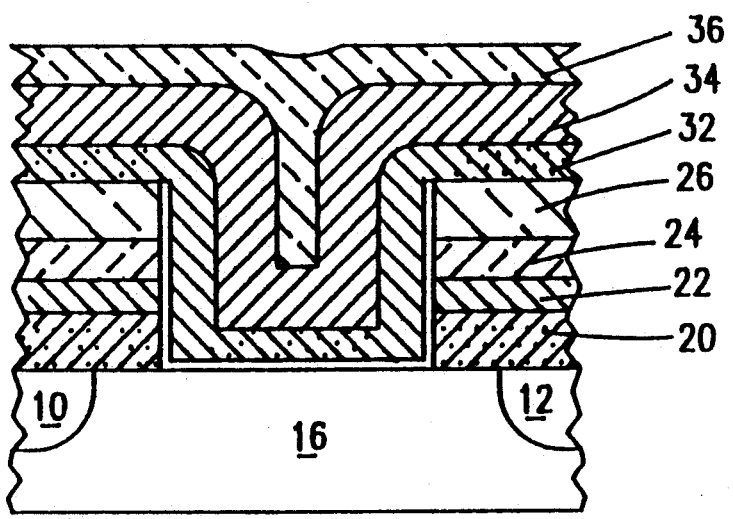

Next the opening 28 is filled by a first conformal CVD layer 32 of doped polysilicon (about 1200Å), next a conformal CVD layer 34 of metal (Tungsten or Moly about 1800Å) and finally a conformal layer 36 of CVD nitride to completely fill the opening 28. FIG. 3 illustrates the process to this point.

Figure 4:
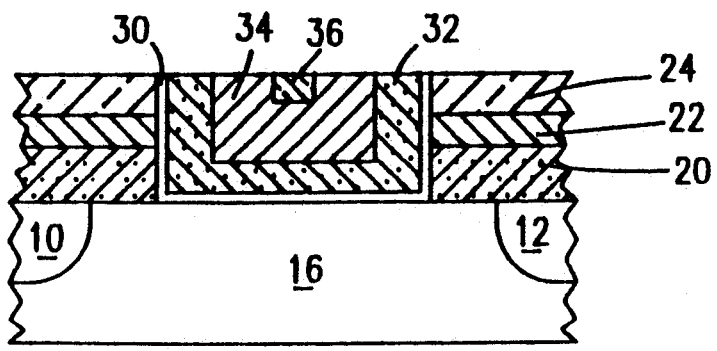

The nitride layer 36 is etched in a $CF_4$ plasma to remove the nitride on the upper horizontal surface and then the exposed upper surface is chemically- mechanically polished stopping at the upper surface of second nitride layer 24. FIG. 4 illustrates the product at the completion of this process step.

Figure 5:
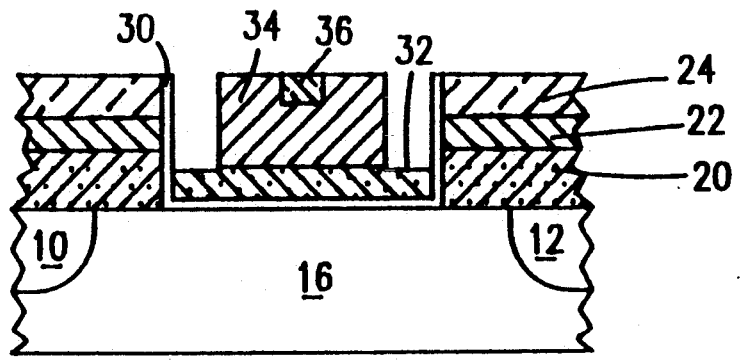

A two-step RIE is used to form the inverse T-gate, by first removing the exposed vertical edges of the polysilicon layer 32 with an RIE that etches polysilicon at a much higher rate than nitride or metal. The second RIE etches the remaining polysilicon layer 32 completely to the oxide layer 30 in the region where it extends out from under the metal layer 34. At the same time this second RIE etches the metal layer 34 at a high rate until the remaining metal subtends the nitride cap formed by layer 36. The first RIE may use, for example, the $NF_3$ plasma process described in C. K. Korman, et al. "Etching Characteristics of Polysilicon, SiO2 and MoSi2 In NF3 and SF6 Plasmas", Solid State Technology, Jan., 1983, p115–124. This process selectively etches the exposed polysilicon layer 32 down to a certain thickness (e.g., 2500Å–2700Å ) so that during second-step etch the exposed polysilicon layer will be completely etched and removed to the gate oxide surface 30. Using the $NF_3$ plasma process the etch rate ratio of polysilicon to metal (i.e. moly) is about 10:1, while to nitride or oxide is 20:1. The end point of this first etch can be determined by timing the etch; the process at this point is shown in FIG. 5.

Figure 6:
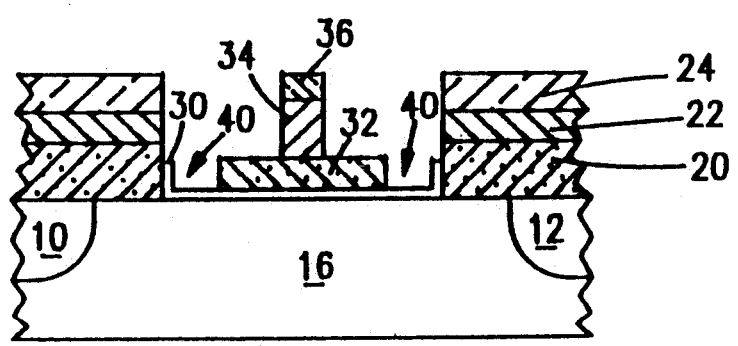

The second-step RIE uses, for example, $Cl_2O_2$ plasma mixture in a process described in T. Ono, et al. "Reactive Ion Stream Etching Utilizing Electron Cyclotron Resonance Plasma", J. Vac. Sci. Technol. B4(3), May 1986, p696–700. This process can be adjusted to have an etch rate ratio of metal to polysilicon of about 2:1 and metal to nitride of about 4:1. An optical emission end point detector can be used to control the etch end point of the metal layer 34. FIG. 6 shows this point in the process Next any RIE damage is removed using a diluted wet silicon etch and, if necessary, silicon oxide is regrown on the active region 16 between edges of the remaining polysilicon layer 32 and the walls of opening 28 and up the walls to the top of the polysilicon layer 20.

Figure 7:
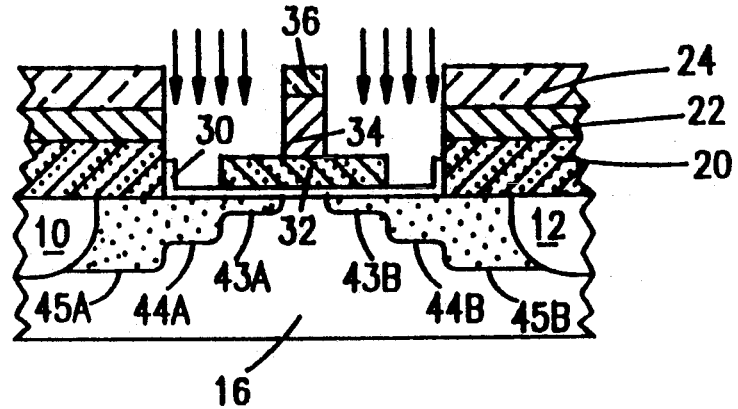
Figure 8:
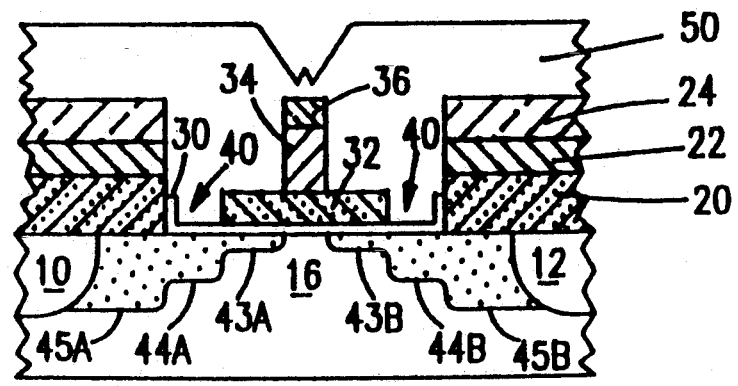

By choosing a proper energy so that it penetrates the polysilicon pad formed by layer 32, an ion implant step simultaneously forms lightly doped areas or regions 43A and 43B beneath the layer 32 and, in addition, more heavily doped source and drain areas or regions 44A and 44B that abut the edge of the polysilicon pad formed by layer 32. The wafer is then annealed to remove implant damage and to diffuse dopant from the extrinsic polysilicon layer 20, which diffusion forms source and drain contact regions 45A and 45B for the source and drain regions; namely, heavily doped regions 44A and 44B and the lightly doped regions 43A and 43B. As indicated in FIG. 7, the inner edges of lightly doped regions 43A, 43B are aligned by and with the edge of the conductor post 34 and extend from the edge of the conductor post 34 to the edge of the polysilicon pad formed of polysilicon layer 32. The inner edges of source and drain regions 44A and 44B are aligned by and with the edge of polysilicon pad 32 and extend from the edge of the polysilicon pad 32 to the edge of the opening 28 in the polysilicon layer 20 and the metal layer 22. The inner edges of heavily doped source and drain contact regions 45A and 45B are aligned by and with the opening 28 in layers 20 and 22 and extend from the edge of the opening 28 under the layers 20 and 22 to the shallow trench wall. A feature and advantage of the present invention is the lightly doped regions 43A, 43B are overlain by the inverted T-gate polysilicon layer 32, providing a lower source drain series resistance than conventional lightly doped drain FET devices.

Next the side support walls for the gate structure are formed by depositing a PECVD oxide layer 50 (FIG. 8) and then polishing back layer 50 to the surface of the nitride layer 24 (FIG. 9).

After the nitride layer 24 is removed with an RIE using a $CF_4/O_2$ plasma, a suitable dielectric layer 54 is deposited and patterned so that contact holes are opened to metal layer 22. The contact holes are then covered with an additional metal layer to form contacts 56 and 58 (FIG. 10).

FIG. 11 shows a top plan view of a completed device, including a gate contact 60 not visible in FIG. 10.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A lightly doped drain, field effect transistor with an inverted T-gate electrode, comprising in combination:
    an active device region in a semiconductor substrate;
    a stack comprised of a doped polysilicon layer and a metal layer, said stack overlying said active device region with an opening in said stack, said opening defining a wall surface;
    a gate electrode disposed on a polysilicon pad in said opening;
    a lightly doped source and drain region in said substrate with its inner edge aligned with an edge of said gate electrode and its outer edge aligned with an edge of said polysilicon pad;
    a heavily doped source and drain region in said substrate with its inner edge aligned with said edge of said polysilicon pad and its outer edge aligned with said wall surface; and
    a source and drain contact region in said substrate with its inner edge aligned with said wall surface and extending from said inner edge aligned with said wall surface under said stack.

2. A lightly doped drain, field effect transistor with an inverted T-gate electrode, comprising in combination:

an active device region in a semiconductor substrate defined by a shallow trench in said semiconductor substrate;

a stack comprised of a doped polysilicon layer and a metal layer, said stack overlying said active device region with an opening in said stack, said opening defining a wall surface;

a gate electrode disposed on a polysilicon pad in said opening;

a lightly doped source and drain region in substrate with its inner edge aligned with an edge of said gate electrode and its outer edge aligned with an edge of said polysilicon pad;

a heavily doped source and drain region in said substrate with its inner edge aligned with said edge of said polysilicon pad and its outer edge aligned with said wall surface; and a source and drain contact region in said substrate with its inner edge aligned with said wall surface and extending from said inner edge aligned with said wall surface under said stack to said shallow trench.

* * * * *